US010305515B1

(12) United States Patent
Weingarten et al.

(10) Patent No.: US 10,305,515 B1
(45) Date of Patent: May 28, 2019

(54) SYSTEM AND METHOD FOR ENCODING USING MULTIPLE LINEAR FEEDBACK SHIFT REGISTERS

(71) Applicant: Avago Technologies International Sales Pte. Limited, Singapore (SG)

(72) Inventors: Hanan Weingarten, Herzelia (IL); Erez Sabbag, Koranit (IL); Amir Nassie, Haifa (IL)

(73) Assignee: Avago Technologies International Sales Pte. Limited, Singapore (SG)

( * ) Notice: Subject to any disclaimer, the term of this patent is extended or adjusted under 35 U.S.C. 154(b) by 389 days.

(21) Appl. No.: 14/612,152

(22) Filed: Feb. 2, 2015

(51) Int. Cl.
*H03M 13/15* (2006.01)
*H03M 13/00* (2006.01)

(52) U.S. Cl.
CPC ......... *H03M 13/158* (2013.01); *H03M 13/15* (2013.01); *H03M 13/6561* (2013.01)

(58) Field of Classification Search
CPC ........................... H03M 13/158; H03M 13/15
See application file for complete search history.

(56) References Cited

U.S. PATENT DOCUMENTS

| | | |
|---|---|---|
| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |
| 5,305,276 A | 4/1994 | Uenoyama |
| 5,440,570 A * | 8/1995 | Wei .................... H03M 13/1575 714/756 |
| 5,592,641 A | 1/1997 | Doyle et al. |
| 5,623,620 A | 4/1997 | Ranjeet et al. |
| 5,640,529 A | 6/1997 | Hasbun |

(Continued)

FOREIGN PATENT DOCUMENTS

WO   WO2009053963 A2   4/2009

OTHER PUBLICATIONS

Search Report of PCT Patent Application WO 2009/118720 A3, dated Mar 4, 2010.

(Continued)

*Primary Examiner* — Joseph D Torres
(74) *Attorney, Agent, or Firm* — Sheridan Ross P.C.

(57) ABSTRACT

An encoder and a method for encoding a first stream of bits, the method may include splitting the first stream of bits to multiple second streams; encoding, in parallel and by using multiple linear feedback shift registers (LFSRs), the multiple second streams to provide third streams, wherein each second stream of the multiple second streams is encoded using an LFSR of the multiple LFSRs; wherein the encoding comprises feeding the multiple second streams to the multiple LFSRs; merging the third streams to provide a fourth stream; wherein the fourth stream is stored in the multiple LFSRs; and encoding the fourth stream to provide a fifth stream; wherein the encoding of the fourth stream comprises concatenating the multiple LFSRs while bypassing feedback circuits of some of the multiple LFSRs; and shifting the fourth stream through the multiple LFSRs.

20 Claims, 14 Drawing Sheets

(56) References Cited

U.S. PATENT DOCUMENTS

| | | |
|---|---|---|
| 5,657,332 A | 8/1997 | Auclair et al. |
| 5,663,901 A | 9/1997 | Harari et al. |
| 5,724,538 A | 3/1998 | Bryg |
| 5,729,490 A | 3/1998 | Calligaro et al. |
| 5,740,395 A | 4/1998 | Hasbun |
| 5,745,418 A | 4/1998 | Hu et al. |
| 5,778,430 A | 7/1998 | Giovannetti |
| 5,793,774 A | 8/1998 | Usui et al. |
| 5,920,578 A | 7/1999 | Zook et al. |
| 5,925,144 A * | 7/1999 | Sebaa .............. G01R 31/31813 714/30 |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,625,688 B1 * | 9/2003 | Fruehling .......... G06F 11/2236 711/109 |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett |
| 7,388,781 B2 | 6/2008 | Litsyn |
| 7,395,404 B2 | 7/2008 | Gorobets |
| 7,441,067 B2 | 10/2008 | Gorobets et al. |
| 7,443,729 B2 | 10/2008 | Li |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell |
| 7,619,922 B2 | 11/2009 | Li |
| 7,697,326 B2 | 4/2010 | Sommer et al. |
| 7,706,182 B2 | 4/2010 | Shalvi et al. |
| 7,716,538 B2 | 5/2010 | Gonzalez |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun |
| 7,961,797 B1 | 6/2011 | Yang et al. |
| 7,975,192 B2 | 7/2011 | Sommer |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang |
| 8,250,324 B2 | 8/2012 | Haas |
| 8,300,823 B2 | 10/2012 | Bojinov |
| 8,305,812 B2 | 11/2012 | Levy |
| 8,327,246 B2 | 12/2012 | Weingarten |
| 8,407,560 B2 | 3/2013 | Ordentlich |
| 8,417,893 B2 | 4/2013 | Khmelnitsky |
| 8,949,493 B1 * | 2/2015 | Wortman ................. G06F 5/00 377/26 |
| 2001/0034815 A1 | 10/2001 | Dugan et al. |
| 2001/0048380 A1 * | 12/2001 | Medlock ................ G06F 7/584 341/50 |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2002/0156988 A1 | 10/2002 | Sekibe |
| 2002/0174156 A1 | 11/2002 | Birru |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Jeong |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0059768 A1 | 3/2004 | Denk |
| 2004/0080985 A1 | 4/2004 | Chang et al. |
| 2004/0153722 A1 | 8/2004 | Lee |
| 2004/0153817 A1 | 8/2004 | Norman et al. |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0058290 A1 * | 3/2005 | Kryzak ............. H04L 25/03866 380/268 |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima et al. |

(56) References Cited

U.S. PATENT DOCUMENTS

| | | |
|---|---|---|
| 2006/0101193 A1 | 5/2006 | Murin |
| 2006/0195651 A1 | 8/2006 | Estakhri |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0092250 A1* | 4/2009 | Lablans .................. G06F 7/582 380/255 |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0132755 A1 | 5/2009 | Radke |
| 2009/0027961 A1 | 6/2009 | Park |
| 2009/0144598 A1 | 6/2009 | Yoon |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi |
| 2009/0287930 A1 | 11/2009 | Nagaraja |
| 2009/0300269 A1 | 12/2009 | Radke et al. |
| 2009/0323942 A1 | 12/2009 | Sharon |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0174853 A1 | 7/2010 | Lee |
| 2010/0180073 A1 | 7/2010 | Weingarten et al. |
| 2010/0172179 A1 | 8/2010 | Gorobets et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette |
| 2010/0149881 A1 | 11/2010 | Lee et al. |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang |
| 2011/0209028 A1 | 8/2011 | Post |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |

(56) References Cited

U.S. PATENT DOCUMENTS

| | | | |
|---|---|---|---|
| 2012/0005554 A1 | 1/2012 | Steiner et al. | |
| 2012/0005558 A1 | 1/2012 | Steiner et al. | |
| 2012/0005560 A1 | 1/2012 | Steiner et al. | |
| 2012/0008401 A1 | 1/2012 | Katz et al. | |
| 2012/0008414 A1 | 1/2012 | Katz et al. | |
| 2012/0017136 A1 | 1/2012 | Ordentlich et al. | |
| 2012/0051144 A1 | 3/2012 | Weingarten et al. | |
| 2012/0063227 A1 | 3/2012 | Weingarten et al. | |
| 2012/0066441 A1 | 3/2012 | Weingarten | |
| 2012/0110250 A1 | 5/2012 | Sabbag et al. | |
| 2012/0124273 A1 | 5/2012 | Goss et al. | |
| 2012/0246391 A1 | 9/2012 | Meir | |
| 2013/0191427 A1* | 7/2013 | Farrugia | G06F 7/582 708/250 |

OTHER PUBLICATIONS

Search Report of PCT Patent Application WO 2009/095902 A3, dated Mar 4, 2010.
Search Report of PCT Patent Application WO 2009/078006 A3, dated Mar 4, 2010.
Search Report of PCT Patent Application WO 2009/074979 A3, dated Mar 4, 2010.
Search Report of PCT Patent Application WO 2009/074978 A3, dated Mar 4, 2010.
Search Report of PCT Patent Application WO 2009/072105 A3, dated Mar 4, 2010.
Search Report of PCT Patent Application WO 2009/072104 A3, dated Mar 4, 2010.
Search Report of PCT Patent Application WO 2009/072103 A3, dated Mar 4, 2010.
Search Report of PCT Patent Application WO 2009/072102 A3, dated Mar 4, 2010.
Search Report of PCT Patent Application WO 2009/072101 A3, dated Mar 4, 2010.
Search Report of PCT Patent Application WO 2009/072100 A3, dated Mar 4, 2010.
Search Report of PCT Patent Application WO 2009/053963 A3, dated Mar 4, 2010.
Search Report of PCT Patent Application WO 2009/053962 A3, dated Mar 4, 2010.
Search Report of PCT Patent Application WO 2009/053961 A3, dated Mar 4, 2010.
Search Report of PCT Patent Application WO 2009/037697 A3, dated Mar 4, 2010.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com), Oct. 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC Test International Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com , 2005.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26, Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

SYSTEM AND METHOD FOR ENCODING USING MULTIPLE LINEAR FEEDBACK SHIFT REGISTERS

BACKGROUND OF THE INVENTION

Linear Feedback Shift Registers (LFSRs) are quite common for numerous applications. LFSRs, amongst other things, are used as encoders of BCH codes which are either used for error correction by themselves or as component codes of larger error correction codes.

In many cases, it is required that an LFSR will be generic with programmable taps. For example, if it is required that we have a configurable BCH encoder, we may need to have programmable taps on the LFSR. The following describes an efficient method for constructing a programmable LFSR that can work at higher frequencies and still maintain full generality.

FIG. 1 shows an example of an LFSR 10 that is used as an encoder in a BCH code. The number of memory cells (D 13) in the LFSR is determined by the length of the code redundancy. Plain data (din) comes in at the "din" input and shifts through the memory cells 13 where feedback from the last cell is added to the data being shifted in. After the last bit has entered the LFSR, the switches "A" and "B" 11 and 18 respectively are switched to the zero state as to disable the feedback and prevent additional data coming in. The remaining data in the shift register is then shifted out and forms the code redundancy.

The description of the encoding in FIG. 1 is not optimal but is only intended to demonstrate how an LFSR is used in an encoder.

FIG. 2 shows a generalized encoder scheme where the taps can be chosen arbitrarily. At the input to each memory cell 13, there is an adder 12 between the data from previous memory cell (or new data) and possible feedback from the first memory cell. A value of a programmable memory cell g_i 15 determines if there will be an added feedback to LFSR memory cell i. By setting the memory cells g_i to different values, we can modify the LFSR function to support any polynomial (with maximal degree equals to the LFSR length).

For example, we can set the g_i memory cells to hold the taps corresponding to a BCH code that corrects upto 3 errors, based on GF($2^9$) or a BCH code that corrects upto 4 errors and based on GF($2^{10}$). Each case has a different amount of active taps (27 Vs 40). This amount corresponds to the redundancy length. The length of the LFSR (the number of memory cell) will be designed for the longest redundancy case we expect. When shorter redundancies are expected, the first taps g0, g1, . . . will be zero and will have no effect on the feedback. Basically, the first memory cells will only act as a delay line, before a shorter LFSR.

This LFSR can also be defined in a mathematical manner as an operation on a polynomial. We define the plain data by the following polynomial:

$$D(x) = \sum_{i=0}^{k-1} d_i \cdot x^{i+r}$$

Where $d_{k-1}$ is the first data bit to enter the encoder and $d_0$ is the last bit into the encoder. The power $X^{i+r}$ at each element represents the corresponding element $d_i$ position in time. In general, multiplying the polynomial D(x) by x represents a shift in time.

The operation of the LFSR can be represented by a modulo function. A modulo by the taps polynomial defined by $$g(x) = \sum_{i=0}^{v-1} g_i \cdot x^i$$

Therefore, the redundancy can be described by the polynomial $$r(x) = \sum_{i=0}^{v-1} r_i \cdot x^i = D(X) \bmod g(x)$$

We can use the above equation to write a relation between the contents of the LFSR at time k and time k+1 as shown below:

$$y_i^{(k+1)} = y_{i-1}^{(k)} + g_i \cdot y_{v-1}^{(k)}, i=0 \ldots v-1, k \geq 0$$

Where $y_i^{(j)}$ is the value of memory cell i at time j in the LFSR and $y_{-1}^{(j)} = d_{k-j}$.

The above equation can be applied recursively to obtain the values of the LFSR after 2, 3 or more shifts.

It is noted this recursive equation can be implemented by an LFSR that may process multiple bits in parallel—e.g. the LFSR content may advance 4 shifts simultaneously at each clock.

FIG. 3 illustrates a prior art LFSR 20. LFSR 20 is configured to process four bits in parallel. It is fed by four bits per cycle Din[0]-Din[3]. It includes (N+1) stages—each stage includes logic 30 and multiple memory cells—and feedback logic 50. First stage memory cells are denoted 40(0,1)-40(0,4), the second stage memory cells are denoted 40(1,1)-40(1,4) and the N'th stage memory cells are denoted 40(N,1)-40(N,4). The feedback logic 50 outputs four feedback signals F[0]-F[4] 80(1)-80(4) to each logic 30 of each of the (N+1) stages. Especially—these four feedback signals are fed to each logic subset (such as 30(1)) that is connected between each pair of memory cells of successive stage—such as between memory cell LFRS[n] 40(0,1) and memory cell LFRS[n+4] 40(1,1). Especially, logic subset 30(1) includes four AND gates and a XOR gate that has five inputs—four inputs for receiving the output signals of the four AND gates and one for receiving the output signal of the memory cell LFRS[n] 40(0,1). The four AND gates perform four AND operations between each one of four feedback signals F[0]-F[4] 80(1)-80(4) and each one of polynomial coefficients Poly[n+1]-Poly[n+4] 70(1)-70(4).

FIG. 4 illustrates the memory cell of the last stage of the LFSR (40(N,1)-40(N,4) and feedback logic 50 of FIG. 3. Each one of four feedback signals F[0]-F[4] 80(1)-80(4) is generated by a separate branch of feedback logic 50.

The length of the longest branch of the feedback logic increases with the amount of bits that are managed in parallel to each other. The first branch is merely a line from the output port of memory cell 40(N,1). The second branch includes AND gate 51 and XOR gate 52 and has a latency of two gates. The third branch includes two AND gates 51 and two XOR gates 52 and has a latency of four gates. The fourth branch includes three AND gates 51 and three XOR gates 52 and has a latency of six gates.

It is apparent that the more shifts are handled at once, the more logic is needed, and therefore the lower the limit on the clock frequency.

FIG. 4 is not the only method for performing multiple LFSR shifts in one clock but the basic problem remains. The higher the number of shifts the lower is the limit on the clock frequency.

The following describes a method allowing multiplying the LFSR shifts without limiting the clock frequency.

SUMMARY

According to an embodiment of the invention there may be provided a method for managing an encoding process, the method may include splitting the first stream of bits to multiple second streams; encoding, in parallel and by using multiple linear feedback shift registers (LFSRs), the multiple second streams to provide third streams, wherein each second stream of the multiple second streams may be encoded using an LFSR of the multiple LFSRs; wherein the encoding may include feeding the multiple second streams to the multiple LFSRs; merging the third streams to provide a fourth stream; wherein the fourth stream may be stored in the multiple LFSRs; and encoding the fourth stream to provide a fifth stream; wherein the encoding of the fourth stream may include concatenating the multiple LFSRs while bypassing feedback circuits of some of the multiple LFSRs; and shifting the fourth stream through the multiple LFSRs.

The shifting of the fourth stream may include performing multiple (M) shift operations, wherein M may be a positive integer and equals an aggregate length of the multiple LFSRs.

The encoding of the multiple second streams may include performing M/K shift operations, wherein K may be a number of the multiple LFSRs.

The encoding may include performing multiple (Q) zero shifting operation after feeding the multiple second streams to the multiple LFSRs; wherein Q may be a positive integer, and wherein the shifting of the fourth stream may include performing (M−J) shifting operations, wherein J may be a positive integer and may be responsive to Q and wherein M equals an aggregate length of the multiple LFSRs.

J may equal Q*2.

Q may be selected in response to a relationship between a length of each LFSR and a length of each second stream.

The method may include determining whether to bypass at least one stage of each LFSR in response to a relationship between a length of each LFSR and a length of each second stream.

The merging of the third streams may include concatenating sets of bits, wherein each set of bits may include bits that may be located at a same respective location in each one of the different third streams, wherein an order of the sets of bits corresponds to respective locations of bits of the sets of bits. For example—the first set of bits will include the first bits of the different third streams, the second set of bits (that follows the first set of bits) will include the second bits of the different third streams, the third set of bits (that follows the second set of bits) will include the second bits of the different third streams. In general, the z'th set of bits will include the z'th bits of each one of the third streams and will follow the (z−1)'th set of bits. Index z is an integer that ranges between 1 to the length of a third stream.

The merging of the third streams may be executed during a single clock cycle.

The number of the multiple second streams may be a power of two.

According to an embodiment of the invention there may be provided an encoder for encoding a first stream of bits, the encoder may include multiple linear feedback shift registers (LFSRs); logic, coupled to the multiple LFSRs. The logic may be configured to: split the first stream of bits to multiple second streams; and feed the multiple second streams to the multiple LFSRs in parallel. The multiple LFSRs may be configured to encode, in parallel, the multiple second streams to provide third streams, wherein each second stream of the multiple second streams may be encoded using an LFSR of the multiple LFSRs. The logic may also be configured to merge the third streams to provide a fourth stream; wherein the fourth stream may be stored in the multiple LFSRs; and concatenate the multiple LFSRs while bypassing feedback circuits of some of the multiple LFSRs. At least one of the multiple LFSRs may be configured to encode the fourth stream to provide a fifth stream. The logic may be configured to shift the fourth stream through the multiple LFSRs during the encoding of the fourth stream.

The encoder may be configured to perform, during the encoding of the fourth stream, multiple (M) shift operations of the fourth stream, wherein M may be a positive integer and equals an aggregate length of the multiple LFSRs.

The encoding of the multiple second streams may include performing M/K shift operations, wherein K may be a number of the multiple LFSRs.

The encoder may be configured to perform multiple (Q) zero shifting operation after feeding the multiple second streams to the multiple LFSRs; wherein Q may be a positive integer, and wherein a shifting of the fourth stream may include performing (M−J) shifting operations, wherein J may be a positive integer and may be responsive to Q and wherein M equals an aggregate length of the multiple LFSRs.

J may equal Q*2.

Q may be selected in response to a relationship between a length of each LFSR and a length of each second stream.

The encoder may be configured to determine whether to bypass at least one stage of each LFSR in response to a relationship between a length of each LFSR and a length of each second stream.

The encoder may be configured to merge the third streams by concatenating sets of bits, wherein each set of bits may include bits that may be located at a same respective location in each one of the different third streams, wherein an order of the sets of bits corresponds to respective locations of bits of the sets of bits.

The merging of the third streams may be executed during a single clock cycle.

The number of the multiple second streams may be a power of two.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

Figure 1:
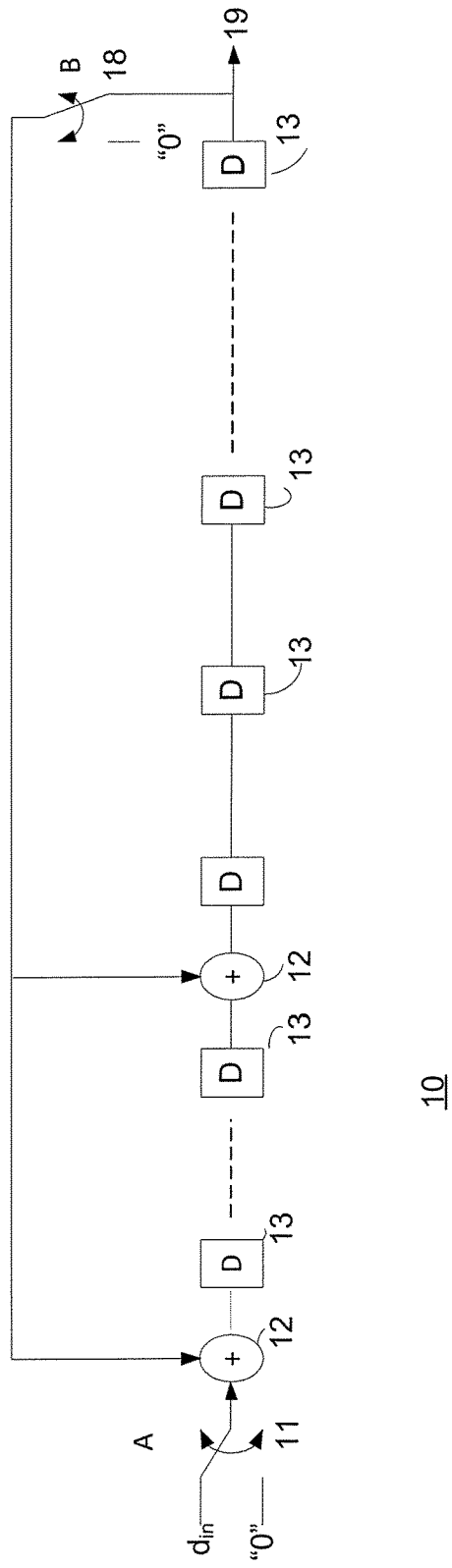
FIGS. 1-4 illustrate prior art circuits.
Figure 2:
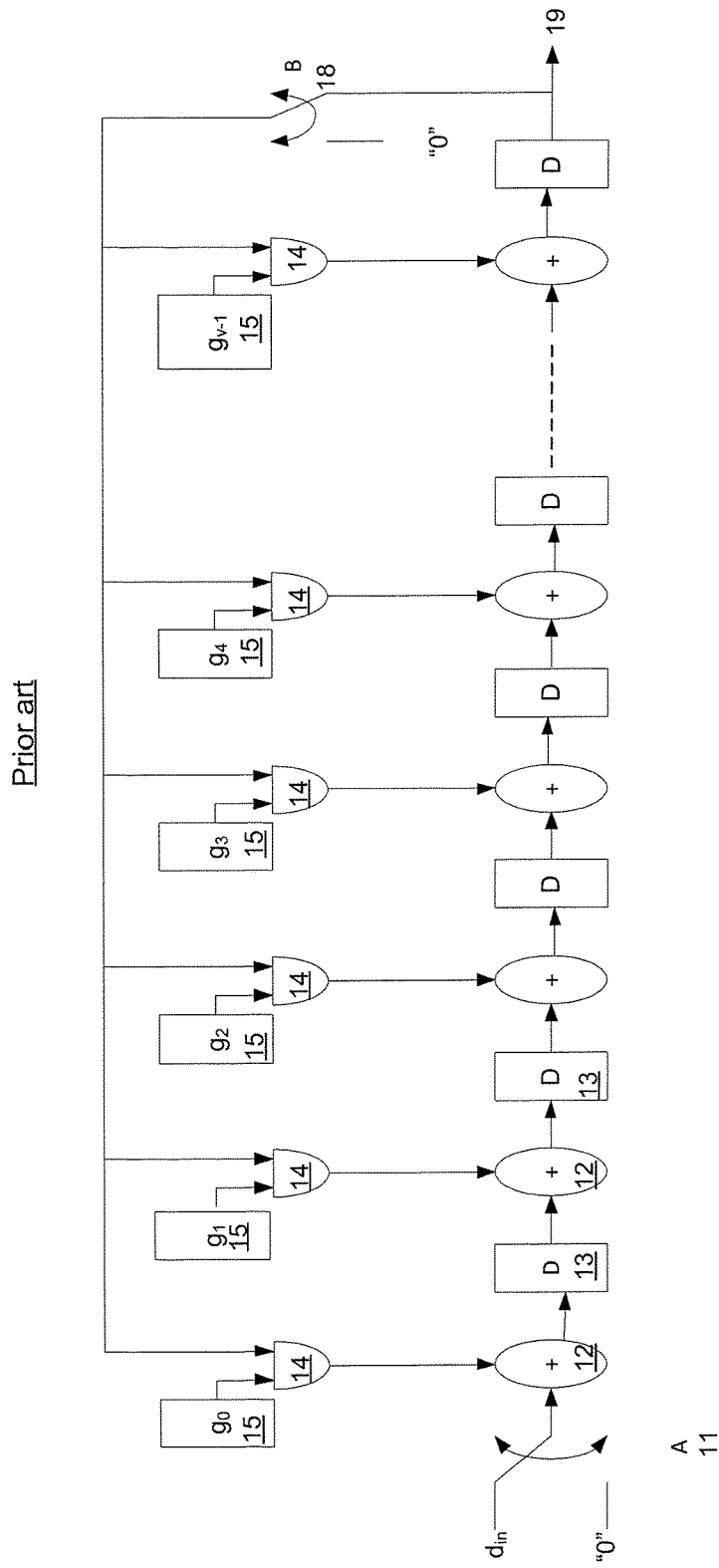
Figure 3:
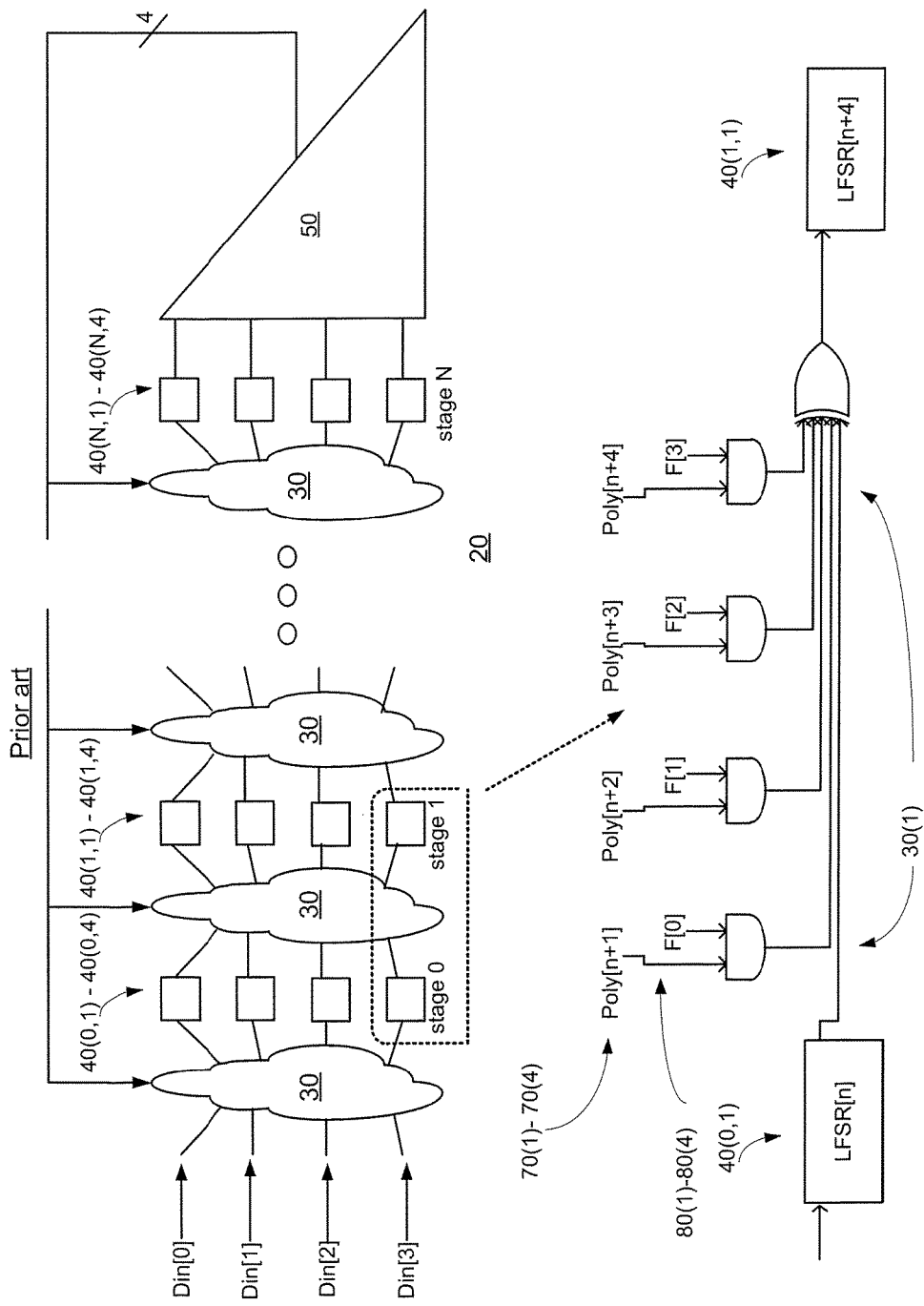
Figure 4:
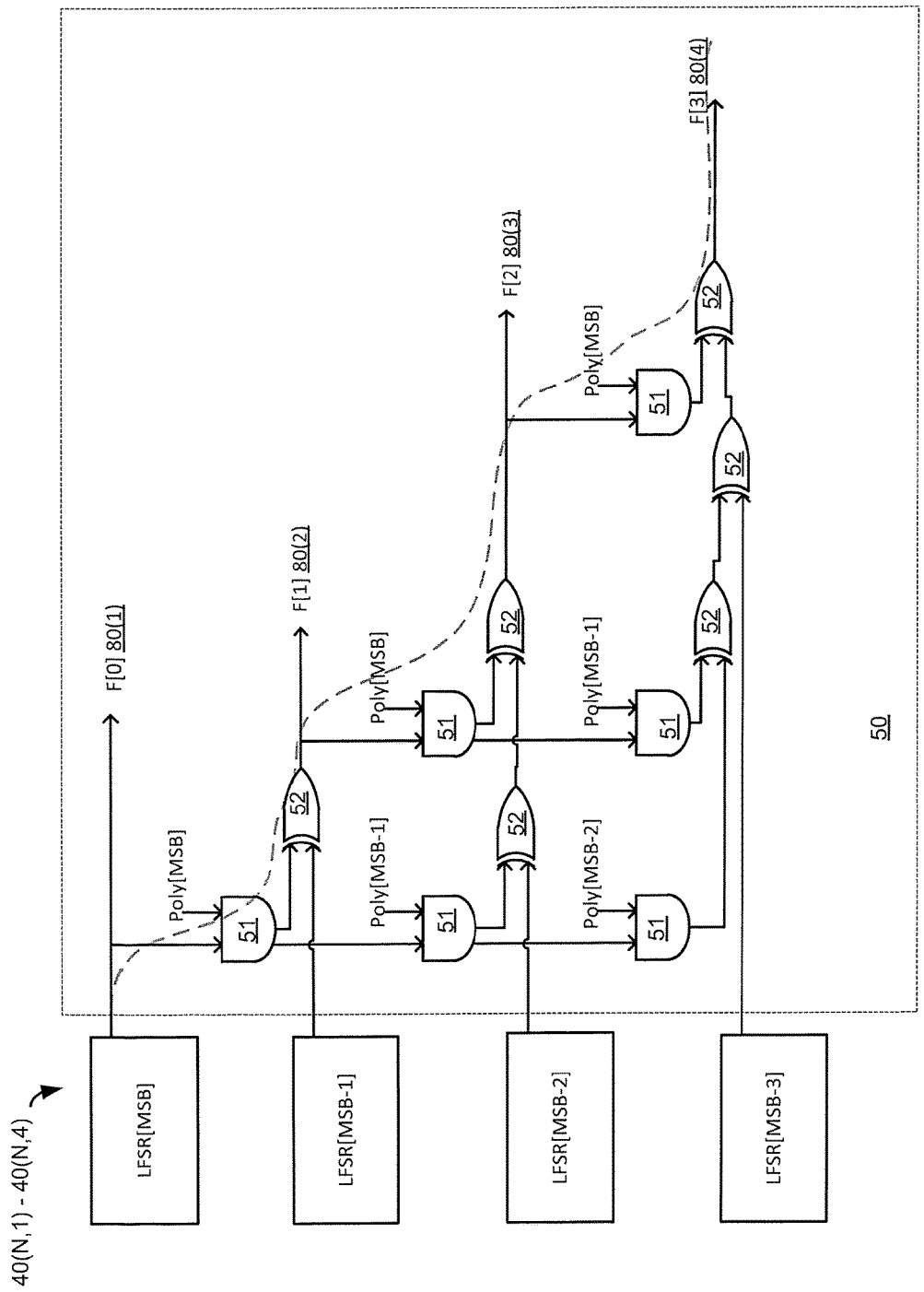

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

Mathematically, the output codeword obtained from the encoding process can be rewritten as defined as follows:
$c(x)=x^{n-k}d(x)+Rem[d(x)x^{n-k}]_{g(x)}=u(x)+Rem[u(x)]_{g(x)}$ Where $(x)=d_0+d_1x+\ldots+d_{k-1}x^{k-1}$, $d_i \in \{0,1\}$, is the input information (in polynomial form, and $d_{k-1}$ is the first input bit), $g(x)$ is the code generating polynomial, and n is the code length. The redundancy bits of the code are represented by the residue polynomial $r(x)$ which is the result of dividing the (shifted) input bits by the generating polynomial of the cyclic code over GF(2) (e.g., BCH). The $Rem[u(x)]_{g(x)}$ is the same as $x^{n-k}d(x) \mod g(x)$ (notation used above) and where $u(x)=x^{n-k}d(x)$.

As described above, the modulo-$g(x)$ operation is implemented using LFSR with the appropriate taps corresponding to the generating polynomial of the code.

We propose to split the first bit stream (first stream) $u(x)$ to second streams, encode each second stream separately (using two LFSR circuits) to provide third streams, then combine the two third streams (by merging these two third streams to a fourth stream and pass the fourth stream through an LFSR) to provide a fifth stream that includes redundancy bits for protecting the first stream.

Clearly, the ability to split the first stream to two second streams (which are handled by two LFSRs) can help to speed-up the encoding process at the expense of additional LFSR, but, without compromising LFSR's clock frequency or generality.

Given first stream $u(x)=d(x)x^{n-k}$, where $u_i \in \{0,1\}$:

a. Split the first stream to two second streams $d_e$ (even bits) and $d_O$ (odd bits) such that: $d_E=(d_0, d_2, \ldots, d_{k-1})$, $d_O=(d_1, d_3, \ldots, d_{k-1})$ b. For each second stream, perform encoding (using a LFSR with the appropriate taps corresponding to the code's generating polynomial) to provide third streams that include residuals. Denote the residues obtained by $r_E$ and $r_O$ respectively, namely $$r_E(x) = Rem[d_e(x)]_{g(x)} = Rem\left[\sum_{i=0}^{\lfloor \frac{k-1}{2} \rfloor} d_{2i}x^i\right]_{g(x)}$$

$$r_O(x) = Rem[d_o(x)]_{g(x)} = Rem\left[\sum_{i=0}^{\lfloor \frac{k-1}{2} \rfloor} d_{2i+1}x^i\right]_{g(x)}$$

c. Merge the two third streams (residues) into a fourth stream R as follows $R=\{r_0^{(e)}r_0^{(o)}r_1^{(e)}r_1^{(o)} \ldots r_{n-k-1}^{(E)} r_{n-k-1}^{(o)}\}$. Mathematically, it can be described as $R(x)=r_E^2(x)+xr_o^2(x)$. Note that the degree of the fourth stream R (x) does not exceed 2(n–k).

d. Finally, pass the fourth stream R again via the LFSR to obtain the fifth stream that include redundancy bits and calculate $r(x)=Rem[R(x)x^{n-k}]_{g(x)}$.

In general, higher parallelism can be obtained by dividing the first stream into any power of 2 second streams and performing similar calculation to those above.

Various Embodiments of Hardware Implementation

As explained above, the configurable multi-bit stream LFSR should support any combination of taps (that correspond to the code's generating polynomial). There are few ways to implement an LFSR circuitry. Here we demonstrate a Galois implementation (a.k.a one-to-many LFSR), other implementation face the same problem of meeting "long feedback logic" timing constraints when increasing the clock frequency.

First Embodiment

From this point on, let us assume we want to widen the incoming data bus from 16 bits to 32 bits, but timing closure does not meet the setup requirements. We also assume (for simplicity that the incoming data is 32 bits aligned) and the LFSR length (degree of the generating polynomial) is aligned to 16 bits.

The implementation assumes we have a LFSR (of 16 parallel bits) with 10 stages (overall supported polynomial degree is 160) that does meet timing requirements. This LFSR has configurable tap option for each register cell, a "Din switch" that selects the incoming data source and a "Feedback switch" (see switches A, B in FIG. 5)

As explained before, we want to calculate:

$$Rem[d(x)x^{n-k}]_{g(x)}=$$

$$Rem[d_e^2(x)x^{n-k}+xd_o^2(x)(x)x^{n-k}]_{g(x)}=$$

$$Rem[r_e^2(x)x^{n-k}+xr_o^2(x)(x)x^{n-k}]_{g(x)}$$

For that purpose we first calculate third streams $r_e(x)$ and $r_o(x)$. Which are the residues of the second streams calculated in separated Even/Odd LFSRs respectively.

Figure 5:
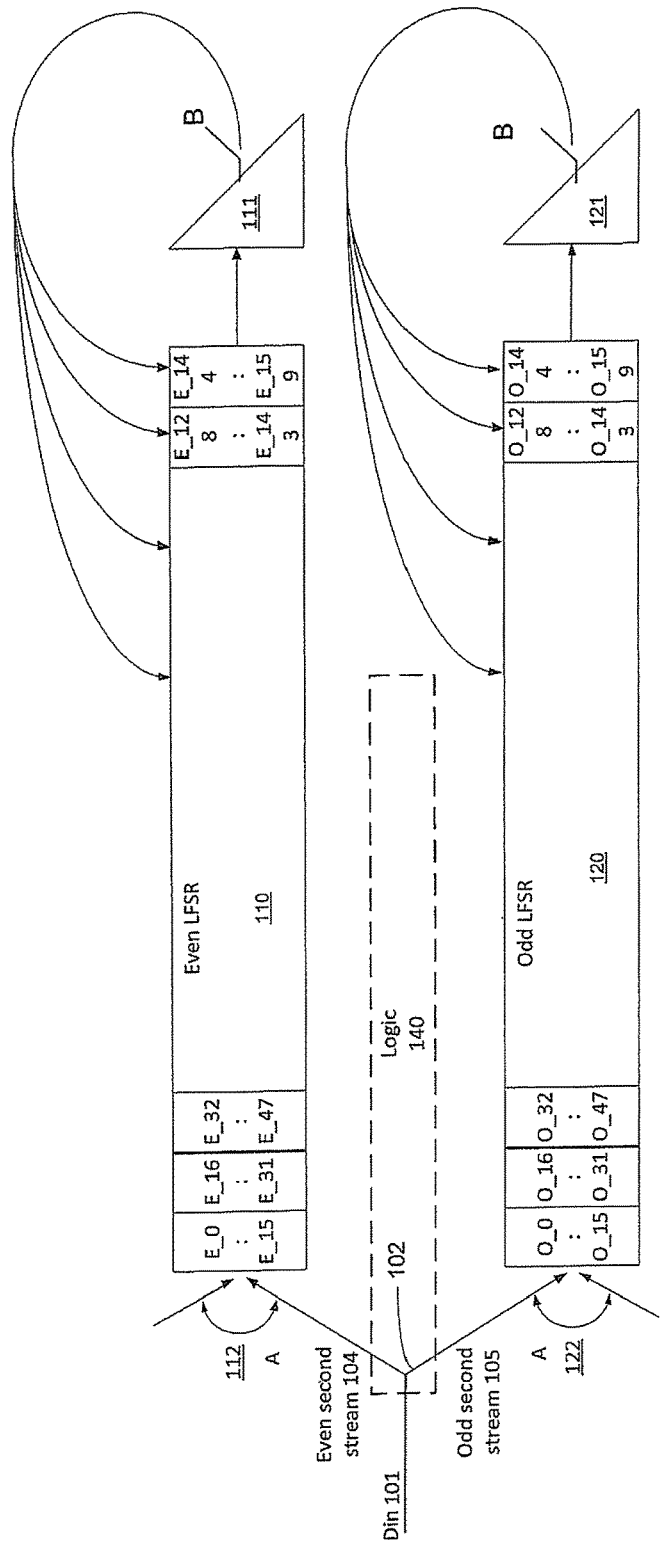
FIGS. 5, 8, 10, 11 and 12 illustrate encoders according to various embodiments of the invention.

FIG. 5 shows the circuitry for an example of a pair of two parallel 16 bits LFSRs 110 and 120 and logic 140 according to an embodiment of the invention.

The encoding process starts by splitting the first stream to two second streams and feeding the second streams to the first and second LFSRs 110 and 120—that are also denoted even LFSR 110 and odd LFSR 120.

The first stream is split (by switch 102 of logic 140) to two second streams—an even second stream 104 and an odd second stream 105 that receive the even and odd bits of the first bits stream respectively. The even LFSR 110 receives the even second stream and the odd LFSR 120 receives the odd second stream.

The feeding step includes a first feeding phase that ends when the last (rightmost) memory cells of each LFSR 110 and 120 receive the first bits of the second streams. Till then the feedback generated by the feedback circuits 111 and 121 is meaningless. Till the end of the first feeding phase the input switches A of both LFSRs are set to their din receiving state—in which they allow bits of the second streams to enter the LFSRs.

FIG. 5 also shows feedback switches B that may allow or prevent feedback from being fed to the LFSRs.

The first feeding phase is followed by an encoding phase during which the odd and even second streams are encoded. This includes shifting the second streams through the odd and even LFSRs while receiving valid feedback. The encoding ends and a generation of the third streams is completed—when bits responsive to the last bits of each one of the odd and even second streams reaches the last memory cells of each LFSR.

At the end of the encoding phase the even LFSR 110 stores $r_e(x)$ and the Odd LFSR 120 stores $r_o(x)$.

This step takes $$t_{ENCODE} = \frac{|D(X)|}{32} \text{ clock cycles.}$$

This is followed by merging the two third streams to a fourth stream. The merging includes creating a fourth stream in which the bits of the two third streams are threaded together.

The merging may include concatenating sets of bits, wherein each set of bits may include bits that may be located at a same respective location in each one of the different third streams, wherein an order of the sets of bits corresponds to respective locations of bits of the sets of bits.

For example—the first set of bits will include the first bits of the different third streams, the second set of bits (that follows the first set of bits) will include the second bits of the different third streams, the third set of bits (that follows the second set of bits) will include the second bits of the different third streams. In general, the z'th set of bits will include the z'th bits of each one of the third streams and will follow the (z-1)'th set of bits. Index z is an integer that ranges between 1 to L, L being the length of a third stream.

An example of the merging may include defining each second stream LFSR bit index within the range $\{0 \ldots L-1\}$ wherein L is a length of each LFSR, defining the LFSR index within the range $\{0 \ldots N-1\}$ wherein N is the number of second stream parallel LFSRs. The merging may include turning the x'th bit of the y'th LFSR to become the (N*x+y)'th bit of the fourth stream.

Figure 6:
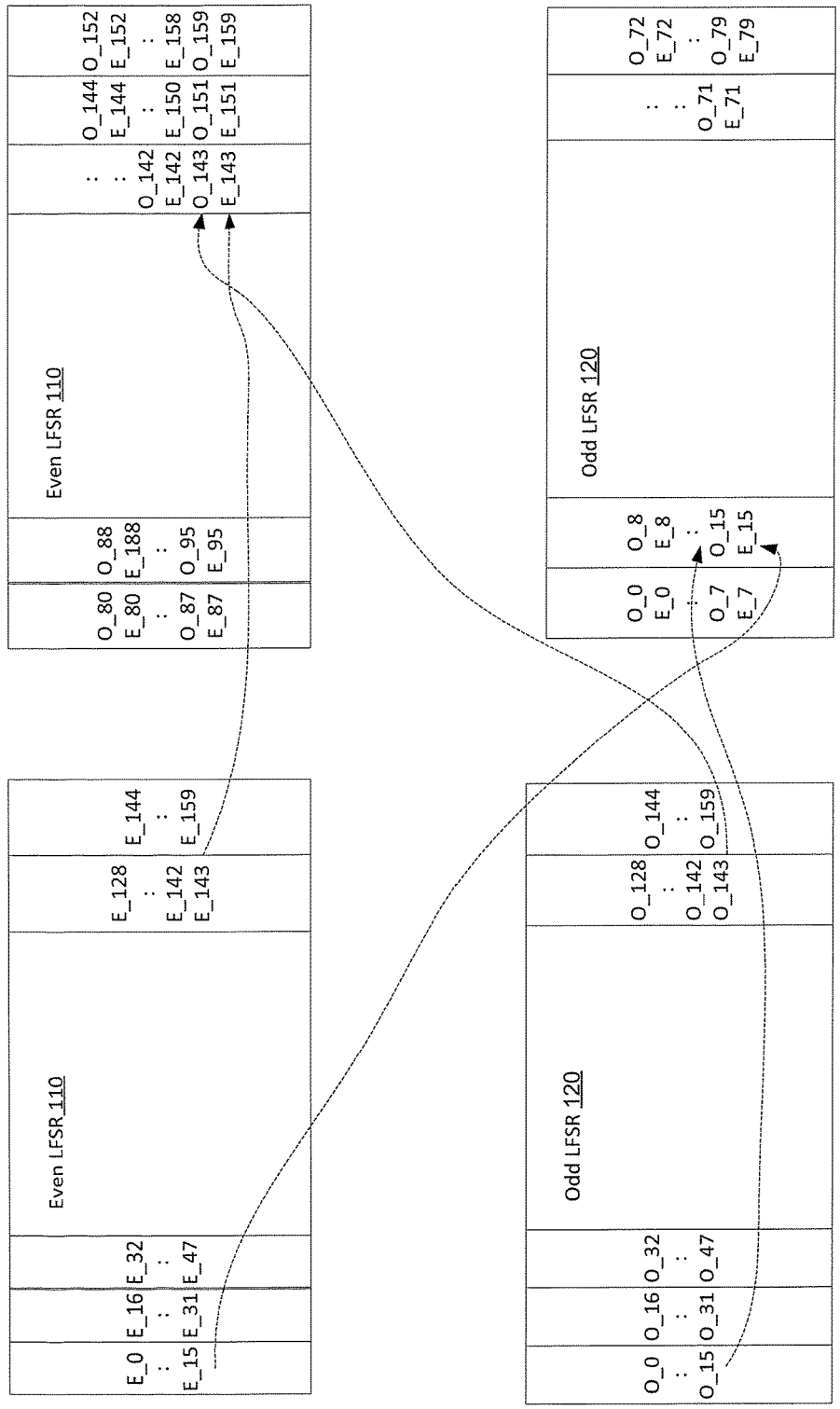
FIG. 6 illustrates a merging operation according to various embodiments of the invention.

To demonstrate on FIG. 6: Bit0 of each LFSR is the leftmost bit, odd LFSR (120) is indexed as LFSR#0, Even LFSR (110) is indexed as LFSR#1:

The merging may be executed during a single clock cycle. Each memory cell receives the content of another memory cell in order to facilitate the merge operation.

The bits are merged in a bit interleaving manner. For example, bit 143 (shown in the FIG. 6) of the even LFSR 110 and bit 143 of the odd LFSR 120 are placed one by the other. Bit 159 of the even LFSR stays in the same register cell.

FIG. 6 illustrates the content of the even and odd LFSRs before and after the merging process. At the end of the merging process a first half that include higher order of even and odd bits of the third streams is stored in the even LFSR. A second half of lower order even and odd bits of the third streams are stored in the odd LFSR.

The merging may take a single clock cycle ($t_{MERGE}$).

After this step is done the LFSRs holds the value: $R(x)=r_E^2(x)+xr_o^2(x)$

Figure 7:
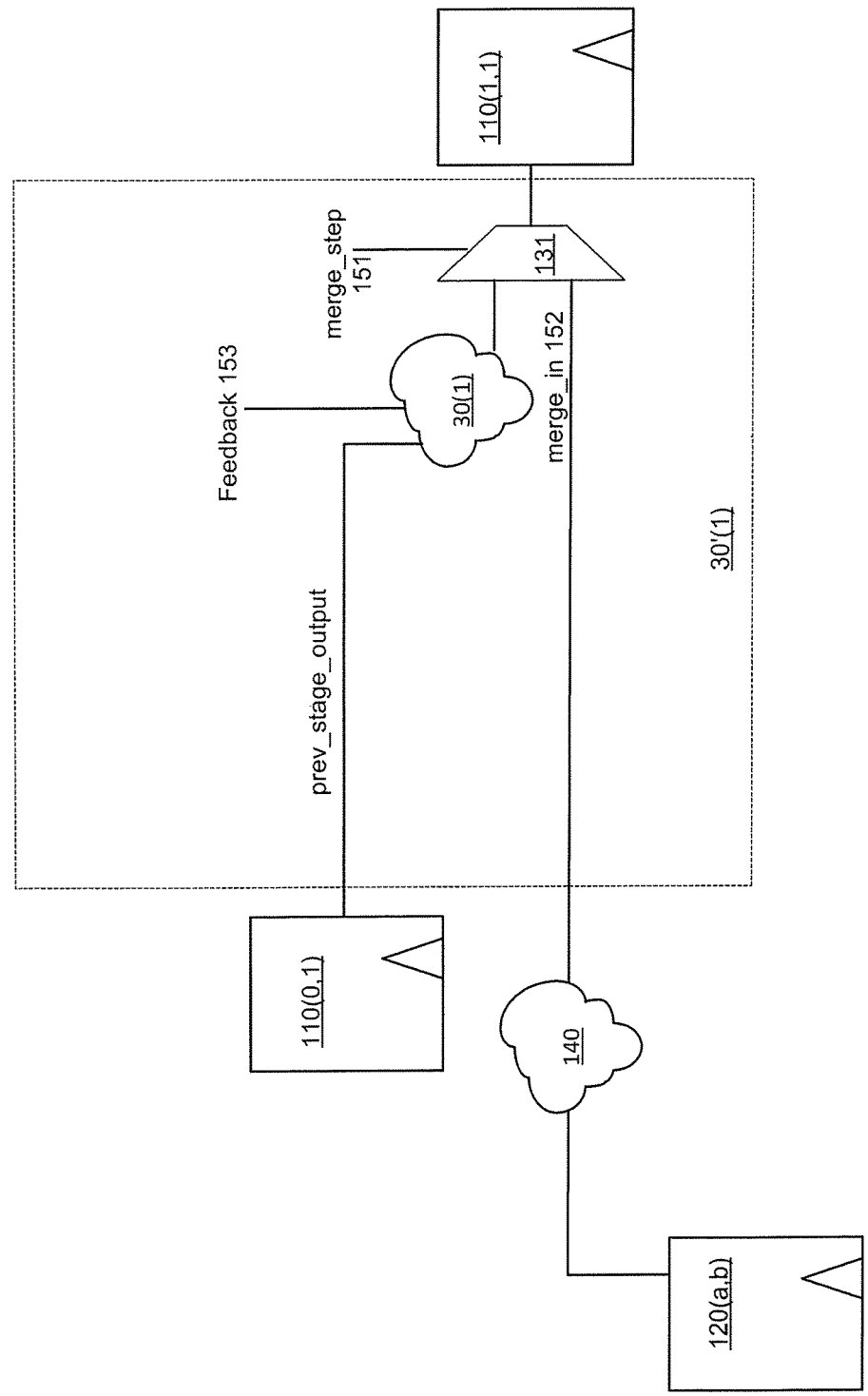
FIGS. 7, 9 and 13 illustrate portions of encoders according to various embodiments of the invention.

FIG. 7 illustrates a logic subset 30(1)' that is connected between each pair of memory cells of successive stage of each LFSR according to an embodiment of the invention.

The logic subset 30'(1) of FIG. 7 facilitates merge and connects a memory cell such as 110(1,1) to a previous memory cell 110(0,1) of the odd LFSR 110 and to another memory cell 120(a,b) of even LFSR 120—for performing the merge operation.

Logic subset 30'(1) includes a multiplexer 131 that may provide (via logic 140) the content (merge_in 152) of 120(a,b) or a content that is affected (by logic subset 30(1)) by feedback 153 and content (prev_stage_output) of the previous memory cell 110(0,1). The multiplexer 131 is controlled by a merge_step control signal 151 that selects merge_in 152 during merge operations.

Figure 9:
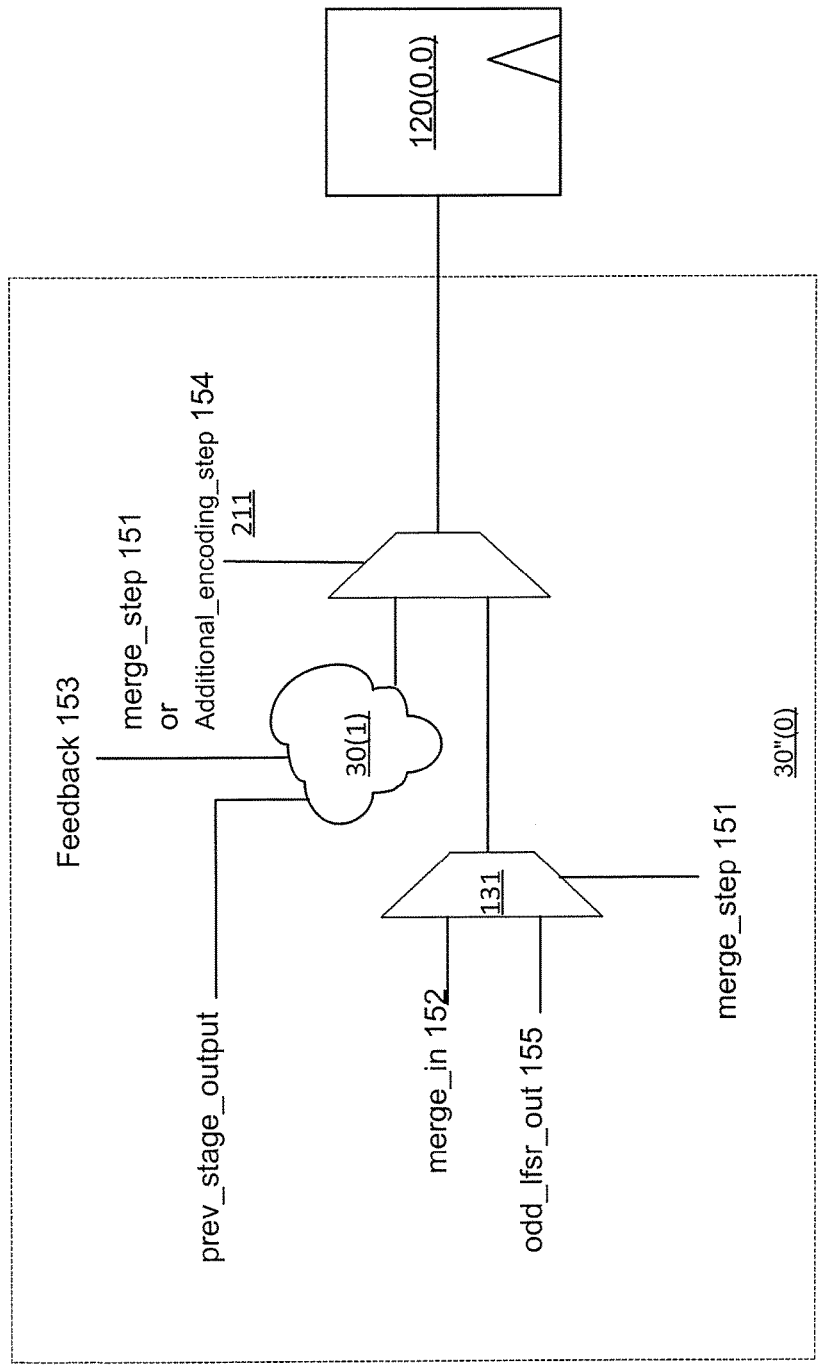

The logic cells of first stage (leftmost) of the even LFSR 110 will be coupled to a more complex logic subset than 30'(1)—FIG. 9 illustrates such a logic subset 30"(1) according to an embodiment of the invention.

Now we want to calculate the residue $Rem[R(x)x^{n-k}]_{g(x)}$.

At this stage the fourth stream is stored in even and odd LFSRs 110 and 120.

The following stage (termed additional encoding) includes encoding the fourth stream to provide a fifth stream.

Figure 8:
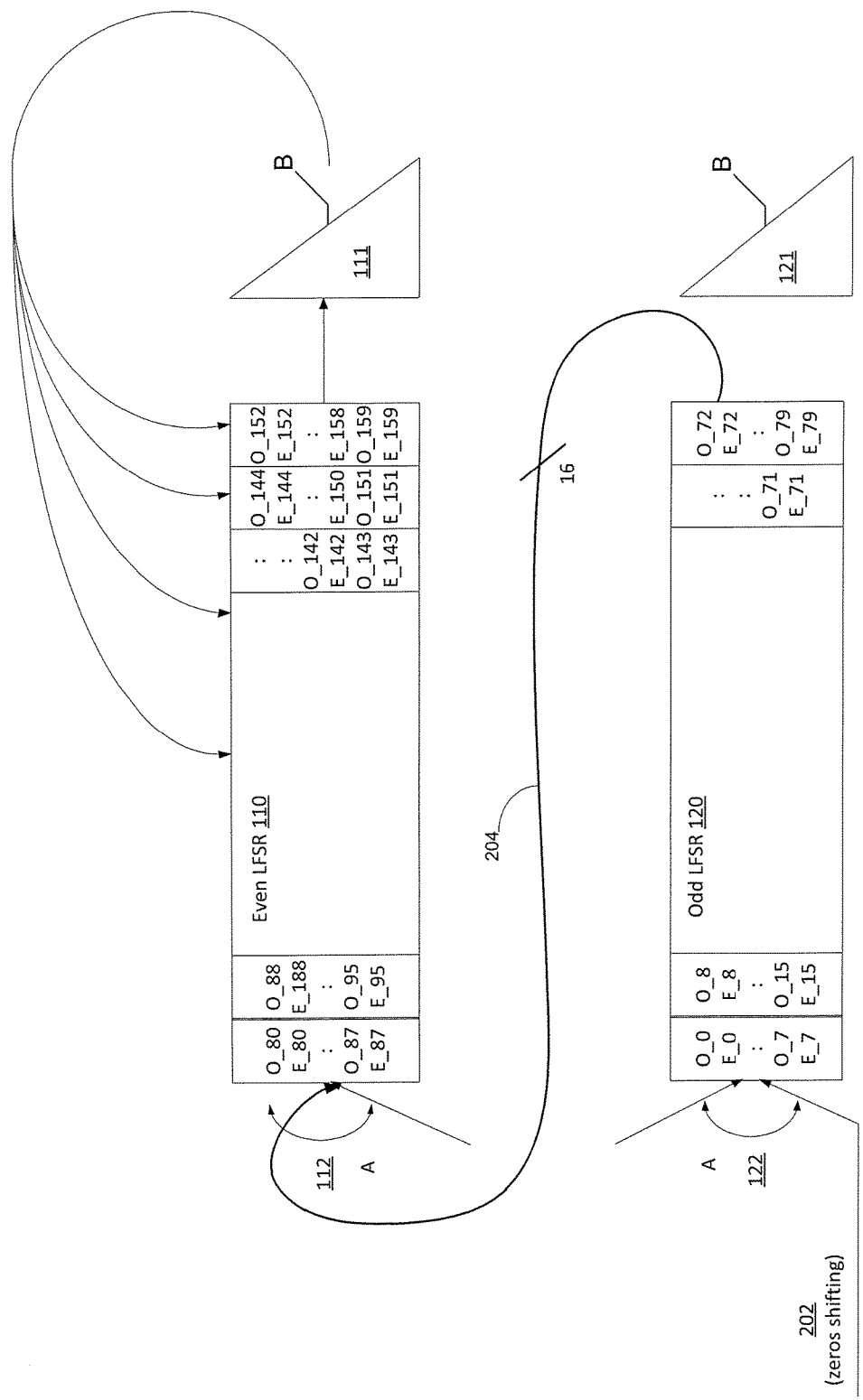

The encoding of the fourth stream includes concatenating the multiple LFSRs (to form a virtual single LFSR) while bypassing feedback circuits of some of the multiple LFSRs. In FIG. 8 the feedback circuit of the odd LFSR 120 is bypassed and it is used only to shift bits to the even LFSR 110—that encodes the fourth stream to provide the fifth stream.

The Odd LFSR 120 shifts zeros in and the Even LFSR 110 is driven by the Odd LFSR 120 output while calculating the fifth stream.

This step ends when the last bit of the first fourth stream R(x) enters the Even LFSR 110.

This step takes $$t_{ADDITIONAL\_ENCODE} = \frac{|r_E(x)|}{16} =$$

$$\frac{|g(x)|}{16} = \frac{n-k}{16} = \text{length of the even } LFSR \text{ (10 cycles in this example)}.$$

Figure 10:
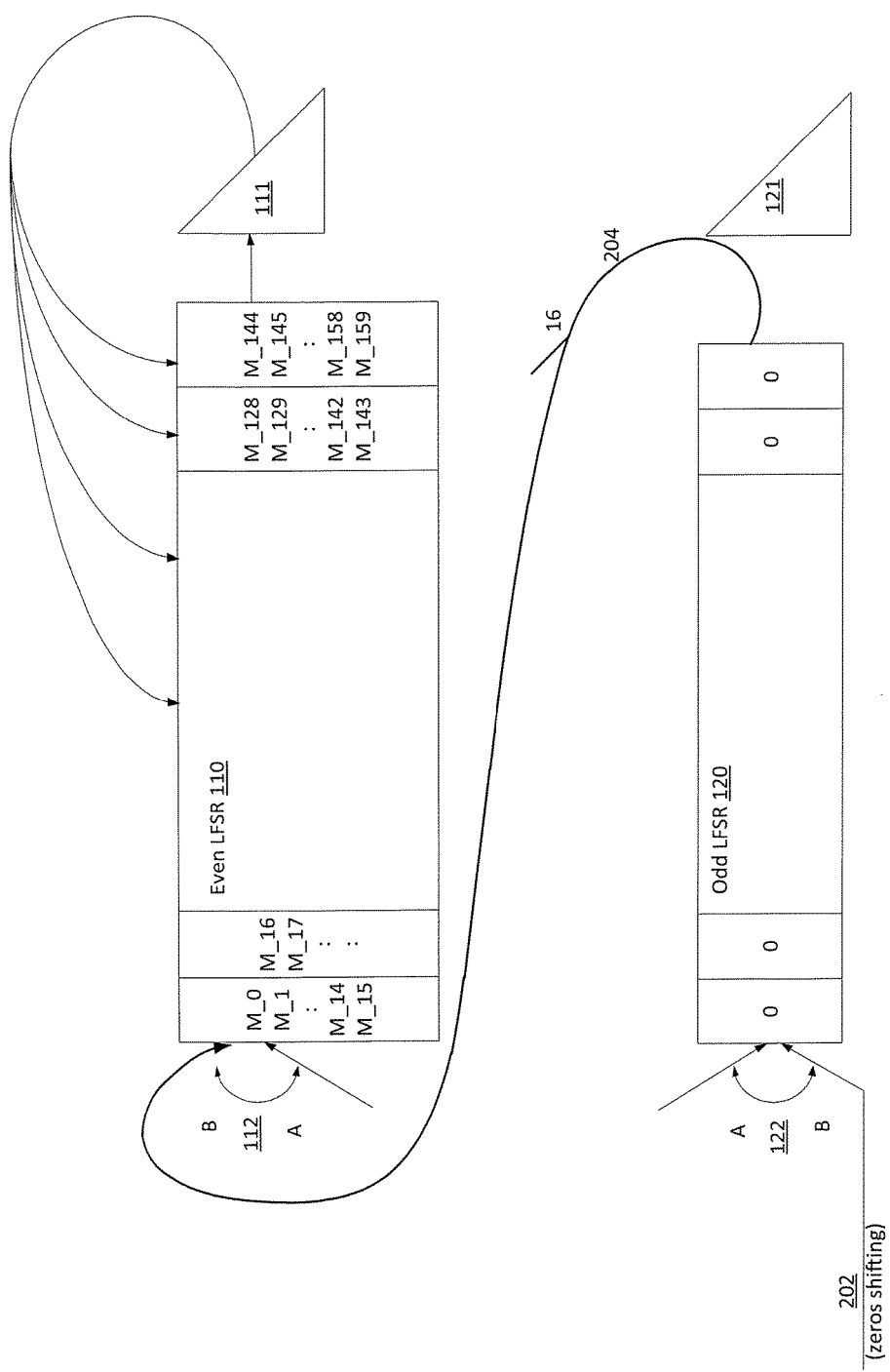

At the end of this step the Even LFSR holds the value: $\text{Rem}[R(x)]_{g(x)}$ and the odd LFSR stores only zeroes—as illustrated in (FIG. 10).

If we want to complete the calculation and get: $[R(x)x^{n-k}]_{g(x)}$, we need to shift in $|r_E(x)|=|g(x)|=n-k$ additional zero cycles.

By the end of the previous stage the Odd LFSR is loaded with zero.

In this step the LFSRs switches stays as in "Additional Encoding" step.

Pushing n−k additional zero cycles into it does not change the Odd LFSR state, but lets the Even LFSR roll n−k cycles whilst getting the desired result:

$$\text{Rem}[R(x)x^{n-k}]_{g(x)}$$

This step also consumes $$t_{ZEROS} = \frac{|r_E(x)|}{16} = \frac{|g(x)|}{16} = \frac{n-k}{16} \text{clock cycles}.$$

Zero Shifting time reduction

The overall calculation time of the suggested basic solution time is:

$$t_{ENCODE} + t_{MERGE} + t_{ADDITIONAL\_ENCODE} + t_{ZEROS} =$$

$$\frac{|D(X)|}{32} + O(1) + \frac{|R(X)|}{16} + \frac{|R(X)|}{16} \text{clock cycles}$$

Any additive time besides $t_{ENCODE}$ is an overhead. This section deals with saving some of the $t_{ZEROS}$ time.

We can mathematically state that:

$$\text{Rem}[r_e^2(x)x^{n-k} + xr_o^2(x)x^{n-k}]_{g(x)} = \text{Rem}\left[\left(r_e(x)x^{\frac{n-k}{2}}\right)^2 + x\left(r_o(x)x^{\frac{n-k}{2}}\right)^2\right]_{g(x)}$$

Let's define (1):

$$\tilde{r}_e(x) = r_e(x)x^{\frac{n-k}{2}}; \tilde{r}_o(x) = r_o(x)x^{\frac{n-k}{2}}$$

We can get $\tilde{r}_e(x)$ by shifting $r_e(x)$ we got after "Din step" by $$\frac{n-k}{2} \text{bits}.$$

That is $$\frac{n-k}{2*16} \text{clock cycles}.$$

By that we enlarge "Din step" by $$\frac{n-k}{2*16} \text{clock cycles}$$

but skip "Zeros step" of $$\frac{n-k}{16} \text{clock cycles}.$$

Overall $$\frac{n-k}{2*16} \text{clock cycles}$$

spared.

Not Aligned Merged LFSRs Outcome

We assume here the payload data is aligned to 32 bits (each cycle the input bus drives all bits), so calculating $r_e(x)$ and $r_o(x)$ is easy. However $\tilde{r}_e(x)$ and $\tilde{r}_o(x)$ are calculated on a payload that is not 32 bits aligned. Moreover, supporting any LFSR length (any generating polynomial degree) means the "Additional Encoding step" data in i.e. the merged $\tilde{R}(x)=\tilde{r}_E^2(x)+x\tilde{r}_0^2(x)$ is not necessarily aligned to 16 bits. The concatenated LFSR input bus is of 16 bits, so apparently driving in the exact required data is an obstacle.

Having an LFSR length of n−k, we can define the 16 bits aligned register chain length $REG_{CH}$=n−k+t where $\text{Rem}[REG_{CH}]_{16}$=0.

Previously it has been shown that zero input shifting by X bits in "ENCODE step" is equal to 2× zero input shifted bits in the "ADDITIONAL_ENCODE step". The following procedure describes how maneuvering the zero shifting between the steps results in the desired outcome when the LFSR is of any length.

The amount of zero input cycle in "ENCODE step" according to equation (1) is (n−k)/2.

We shift only T+(16−t) zero cycles (into the polynomial defined effective LFSR) where T is the largest native number that meets the requirements:

$$\text{Rem}[T]_{16} = 0 \ \& \ T < \frac{n-k}{2}.$$

We define "Zero Debt" ZD=(n−k)/2−(T+(16−t)) that is the amount of zero cycles that still needs to be shifted on the original Even and Odd LFSR. We can then respectively define "Additional encode Zero Debt":

CZD=2*ZD=n−k−2T−32+2t

That is the amount of zero cycles that still needs to be shifted during the ADDITIONAL_ENCODE step through the odd and even LFSRs.

In the ADDITIONAL_ENCODE step we now shift in zero cycles:

n−k+CZD=2*(n−k)−2T−32+2t

This amount of zero cycles is a multiplicand of 16 and at the end the Even LFSR holds the required final result.

Support for any LFSR Length

As described before the invention supports a modulus operation on a generating polynomial g(x) with any desired taps positions. It is noted that any length of the generating polynomial can be supported as well (up to a maximal length implemented).

The naïve way is to place taps only for relevant register cells. All other register cells will operate as a shift register.

Figure 11:
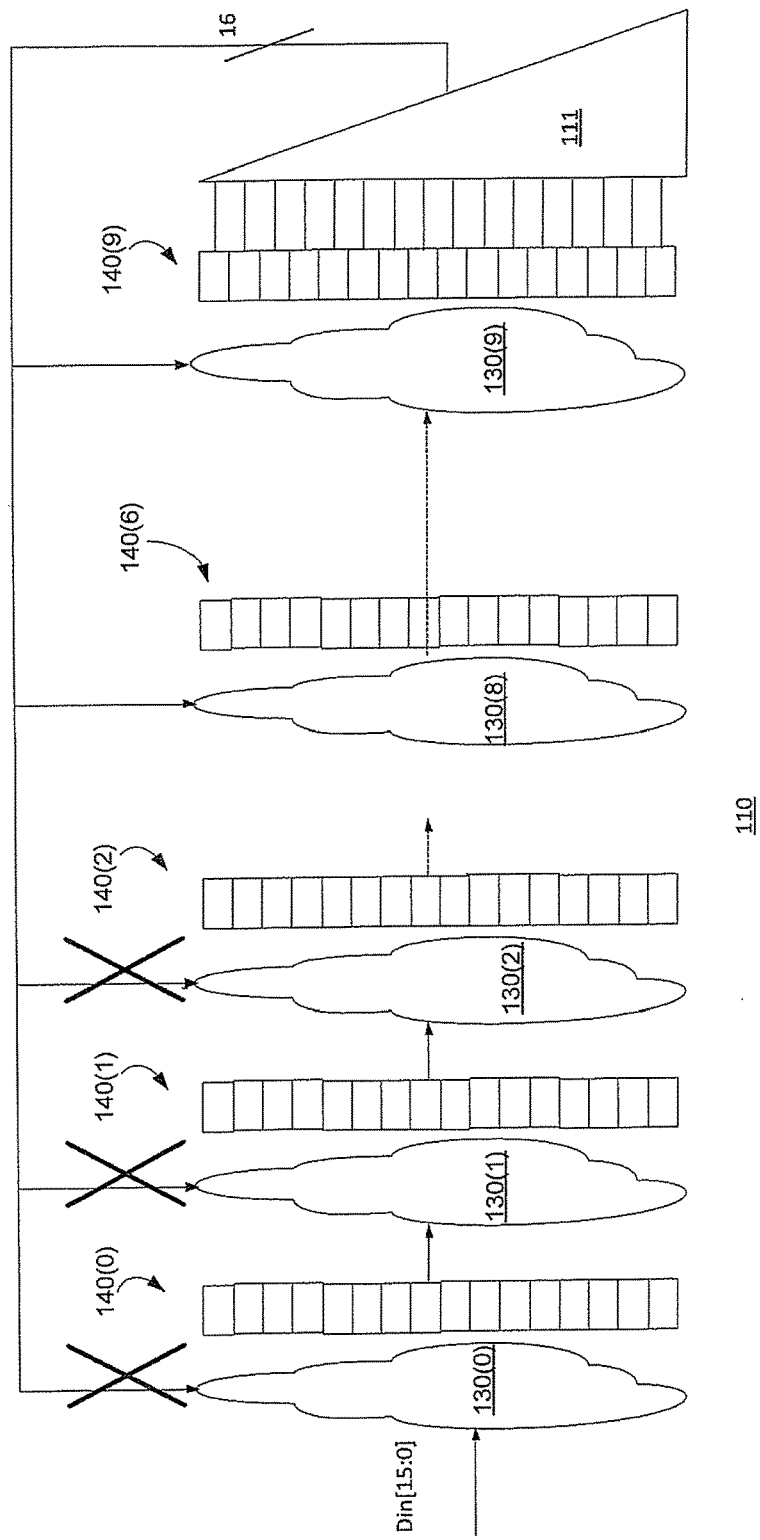

FIG. 11 shows an example of 16 bits parallel LFSR 110 of a maximal length of 160 bits. It has ten logics 130(0)-130(9) and ten stages 140(0)-140(9) of logical cells that are configured in an interleaved manner. Stage 140(9) is followed by feedback circuit 111.

If for example the LFSR needs to be configured to an actual length of 28 bits, only taps that are connected to logics 130(8)-130(9) will be set. The other 128 bits will operate as a shift register meaning data will stream in on the input bus and only after 8 clock cycles the calculation will actually start. This delay lowers the throughput of the calculation module.

In order to save this time we suggest bypassing the delay cause.

Figure 12:
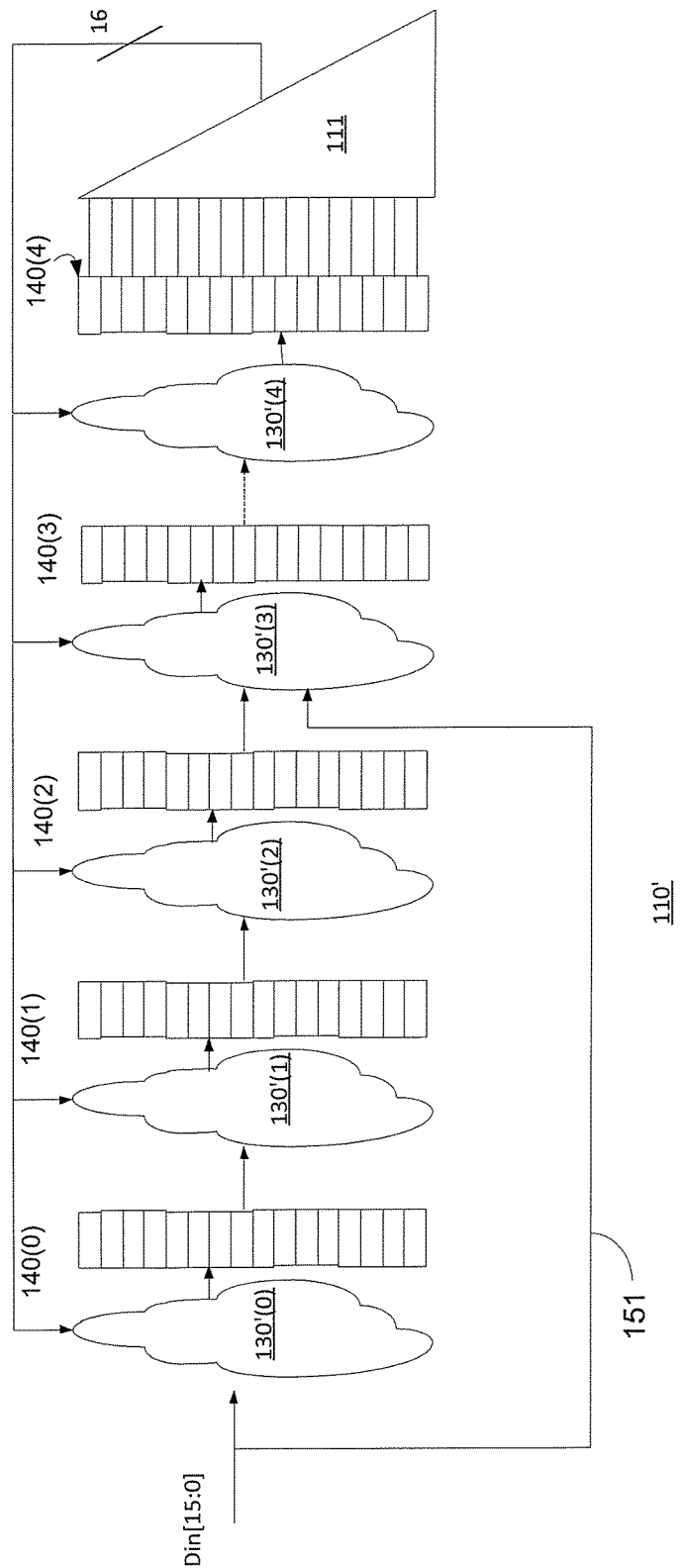

FIG. 12 shows an example of 80 bits maximal LFSR 110' with bypass options. The input data is fed to each one of logics 130'(0)-130'(4) and each one of logics has a bypass circuit that allows it to feed the logical cells that follow it with either information from a previous logical cells or to receive (bypass) Din.

If for example the LFSR needs to be configured to an actual length of 28 bits, the circuit is configured to drive din directly through bypass path 151. According to an embodiment of the invention lower LFSR registers left side to path 151 may be driven with constant (zeros for example) in order not to consume data transition power.

Figure 13:
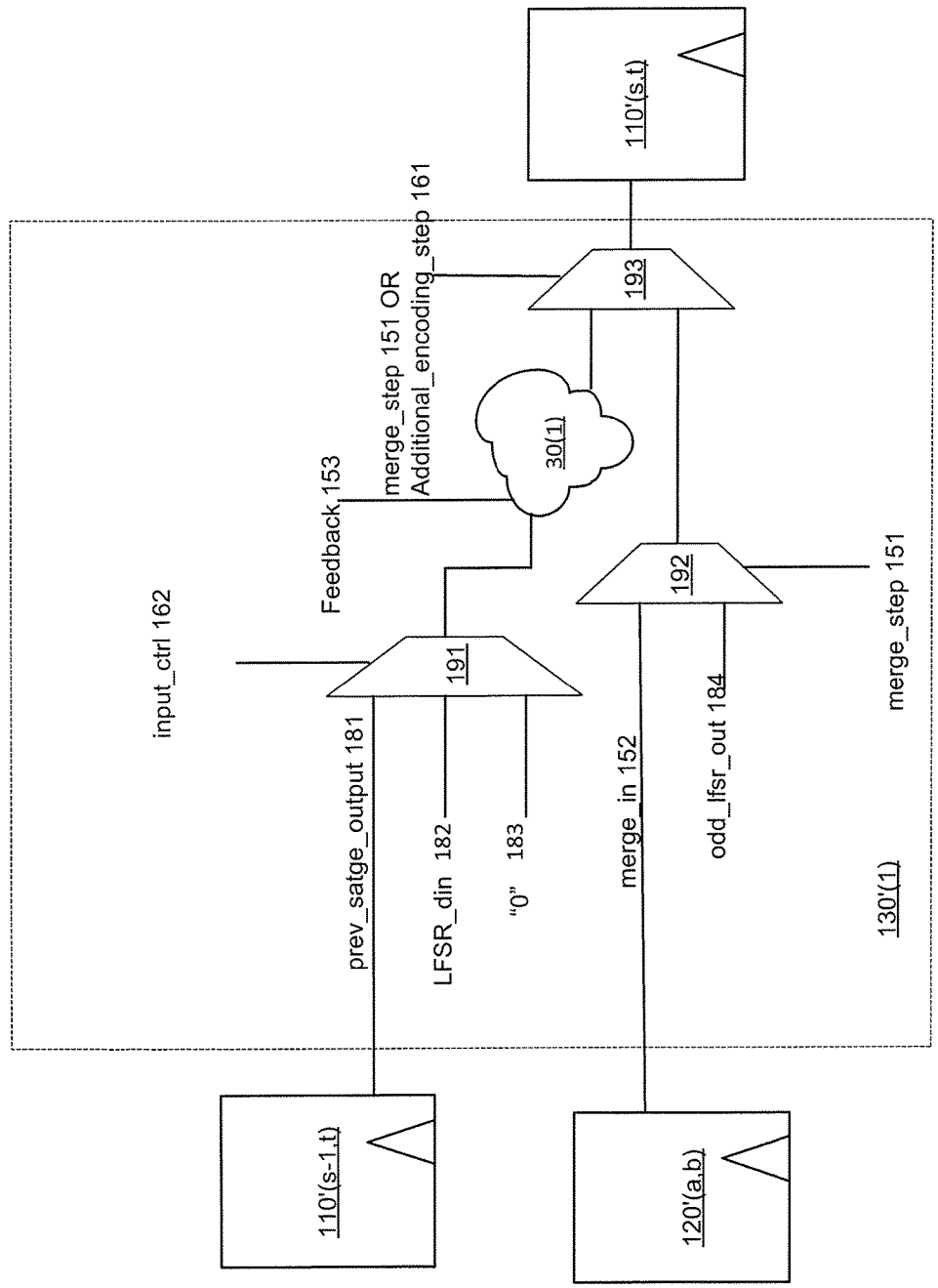

FIG. 13 illustrates a logic subset 130'(1) for allowing data bypasses and three memory cells 110'(s,t), 110'(s−1,t) and 120'(a,b) according to an embodiment of the invention.

Memory cells 110'(s,t) and 110'(s−1,t) belong to the s'th and (s−1)'th stages of even LFSR 110' of FIG. 12. Memory cell 120'(a,b) belongs to another LFSR that has bypass capabilities. During a merge operation the content of memory cell 120'(a,b) should be provided to memory cell 110'(s,t).

A first multiplexer 191 receives prev_stage_output 181 from previous memory cell 110'(s−1,t), an input bit LFSR Din 182, and zero 183 and is controlled by control signal input_cnrl 162.

A second multiplexer 192 receives a merge_in 152 signal from memory cell 120'(a,b) and a odd_lfsr_out 184—which is the output port from a previous LFSR. It is controlled by merge_step 151 control signal.

The output of first multiplexer 191 and feedback 153 are fed to logic subset 30(1). The output of logic subset 30(1) and the output of second multiplexer 192 are provided to third multiplexer 193 that is controlled by merge_step 151 or Addition Encoding step 161. The output of the third multiplexer 193 is provided to memory cell 110'(s,t).

Figure 14:
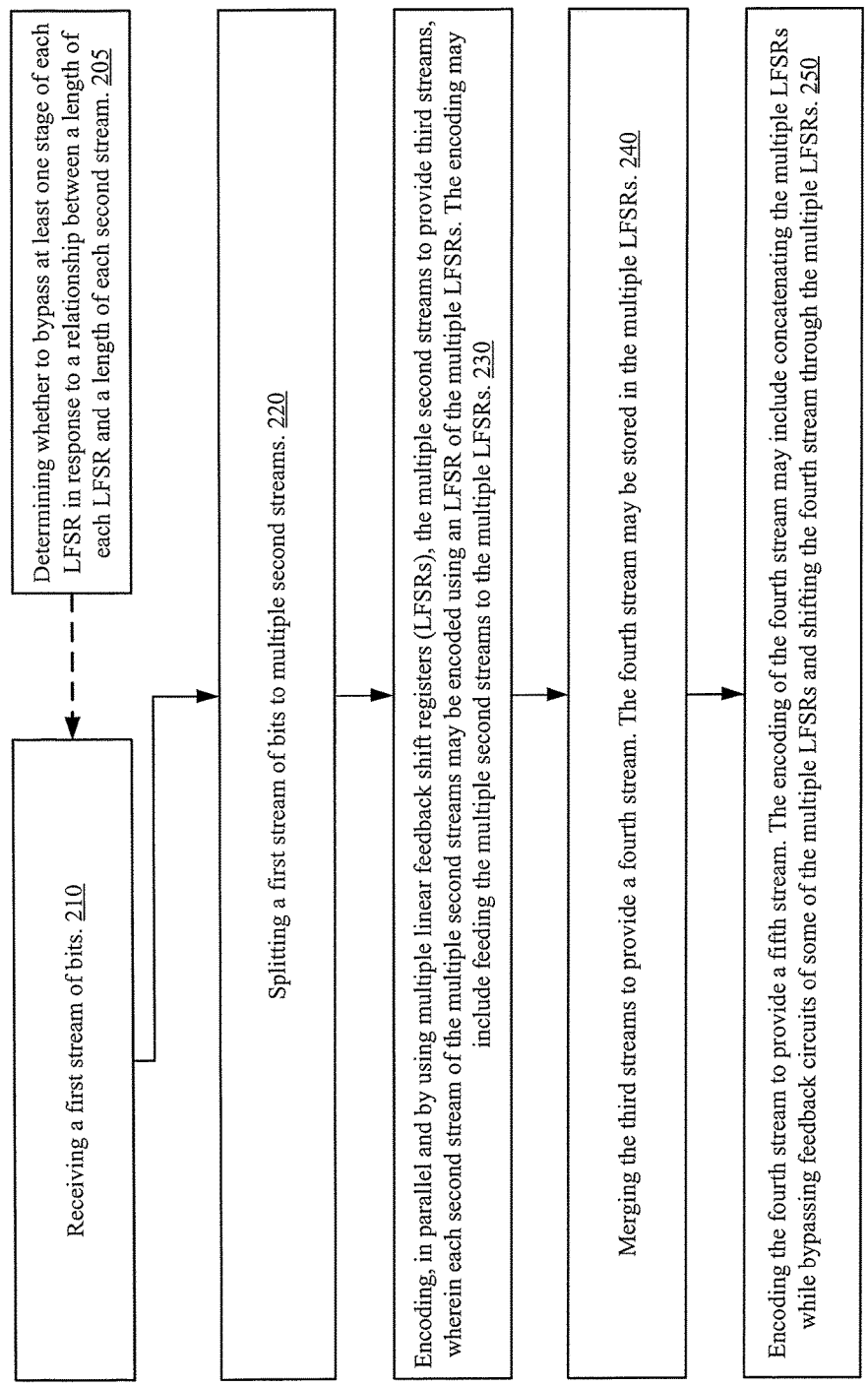
FIG. 14 illustrates a method according to an embodiment of the invention.

FIG. 14 illustrates method 200 according to an embodiment of the invention.

Method 200 may start by stage 210 of receiving a first stream of bits.

Stage 210 may be followed by stage 220 of splitting a first stream of bits to multiple second streams.

The number of the multiple second streams may be a power of two.

Stage 220 may be followed by stage 230 of encoding, in parallel and by using multiple linear feedback shift registers (LFSRs), the multiple second streams to provide third streams, wherein each second stream of the multiple second streams may be encoded using an LFSR of the multiple LFSRs. The encoding may include feeding the multiple second streams to the multiple LFSRs.

Stage 230 may include performing M/K shift operations on each second stream, wherein K may be a number of the multiple LFSRs.

Stage 230 may include performing multiple (Q) zero shifting operation after feeding the multiple second streams to the multiple LFSRs. This may occur, for example, when the size of the second streams differs from the length of the LFSRs. Q may be a positive integer. In this case stage 250 may include performing (M-J) shifting operations, wherein J may be a positive integer and may be responsive to Q and wherein M equals an aggregate length of the multiple LFSRs. J may equal Q*2. Q may be selected in response to a relationship between a length of each LFSR and a length of each second stream.

Stage 230 may include concatenating sets of bits, wherein each set of bits may include bits that may be located at a same respective location in each one of the different third streams, wherein an order of the sets of bits corresponds to respective locations of bits of the sets of bits.

Stage 230 may be executed during a single clock cycle.

Stage 230 may be followed by stage 240 of merging the third streams to provide a fourth stream. The fourth stream may be stored in the multiple LFSR.

Stage 240 may be followed by stage 250 of encoding the fourth stream to provide a fifth stream. The encoding of the fourth stream may include concatenating the multiple LFSRs while bypassing feedback circuits of some of the multiple LFSRs and shifting the fourth stream through the multiple LFSRs.

Stage 250 may include performing multiple (M) shift operations, wherein M may be a positive integer and equals an aggregate length of the multiple LFSRs.

According to an embodiment of the invention method 200 may include stage 205 of determining whether to bypass at least one stage of each LFSR in response to a relationship between a length of each LFSR and a length of each second stream. Step 210 is responsive to the determination (see, for example, FIG. 12).

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removable or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as flash memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for encoding a first stream of bits, comprising:
   splitting with one or more switches, a first input stream of bits to multiple second streams;
   encoding, in parallel and by using multiple linear feedback shift register (LSFR) circuits, the multiple second streams to provide third streams, wherein each second stream of the multiple second streams is encoded using an LFSR circuit of the multiple LFSR circuits; wherein the encoding comprises feeding the multiple second streams to the multiple LFSR circuits;
   merging, with memory cells, the third streams to provide a fourth stream; wherein the fourth stream is stored in the multiple LFSR circuits; and
   encoding the fourth stream to provide a fifth stream; wherein the encoding of the fourth stream comprises concatenating the multiple LFSR circuits while bypassing feedback circuits of some of the multiple LFSR circuits; and
   shifting the fourth stream through the multiple LFSR circuits.

2. The method according to claim 1, wherein the shifting of the fourth stream comprises performing multiple (M) shift operations, wherein M is a positive integer and equals an aggregate length of the multiple LFSR circuits.

3. The method according to claim 1, wherein the encoding of the multiple second streams comprises performing M/K shift operations, wherein K is a number of the multiple LFSR circuits.

4. The method according to claim 1, wherein the encoding of the multiple second streams comprises performing multiple (Q) zero shifting operation after feeding the multiple second streams to the multiple LFSR circuits; wherein Q is a positive integer, and wherein the shifting of the fourth stream comprises performing (M−J) shifting operations, wherein J is a positive integer and is responsive to Q, and wherein M equals an aggregate length of the LFSR circuits.

5. The method according to claim 4, wherein J equals Q*2.

6. The method according to claim 4, wherein Q is selected in response to a relationship between a length of each LFSR circuit and a length of each second stream.

7. The method according to claim 1, comprising determining whether to bypass at least one stage of each LFSR in response to a relationship between a length of each LFSR circuit and a length of each second stream.

8. The method according to claim 1, wherein the merging of the third streams comprises concatenating sets of bits, wherein each set of bits comprises bits that are located at a same respective location in each one of the different third streams, wherein an order of the sets of bits corresponds to respective locations of bits of the sets of bits.

9. The method according to claim 1, wherein the merging of the third streams is executed during a single clock cycle.

10. The method according to claim 1, wherein a number of the multiple second streams is a power of two.

11. An encoder implemented on one or more integrated circuit devices for encoding a first stream of bits, comprising:
   multiple linear feedback shift register (LSFR) circuits;
   logic, coupled to the multiple LFSR circuits, wherein the logic is configured to:
      split, with one or more switches, the first stream of bits to multiple second streams; and
      feed the multiple second streams to the multiple LFSR circuits in parallel;
   wherein the multiple LFSR circuits are configured to encode, in parallel, the multiple second streams to provide third streams, wherein each second stream of the multiple second streams is encoded using an LFSR circuit of the multiple LFSR circuits;
   wherein the logic is configured to:
      merge the third streams to provide a fourth stream; wherein the fourth stream is stored in memory cells of the multiple LFSR circuits; and
      concatenate the multiple LFSR circuits while bypassing feedback circuits of some of the multiple LFSR circuits;
   wherein at least one of the multiple LFSR circuits is configured to encode the fourth stream to provide a fifth stream;
   wherein the logic is configured to shift the fourth stream through memory cells of the multiple LFSR circuits during the encoding of the fourth stream.

12. The encoder according to claim 11, wherein the encoder is configured to perform, during the encoding of the fourth stream, multiple (M) shift operations of the fourth stream, wherein M is a positive integer and equals an aggregate length of the multiple LFSR circuits.

13. The encoder according to claim 11, wherein the encoding of the multiple second streams comprises performing M/K shift operations, wherein K is a number of the multiple LFSR circuits.

14. The encoder according to claim 11 wherein the encoder is configured to perform multiple (Q) zero shifting operation after feeding the multiple second streams to the multiple LFSR circuits; wherein Q is a positive integer, and wherein a shifting of the fourth stream comprises performing (M−J) shifting operations, wherein J is a positive integer and is responsive to Q and wherein M equals an aggregate length of the multiple LFSR circuits.

15. The encoder according to claim 14, wherein J equals Q*2.

16. The encoder according to claim 14, wherein Q is selected in response to a relationship between a length of each LFSR circuit and a length of each second stream.

17. The encoder according to claim 11, wherein the encoder is configured to determine whether to bypass at least one stage of LFSR circuit in response to a relationship between a length of each LFSR circuit and a length of each second stream.

18. The encoder according to claim 11, wherein the encoder is configured to merge the third streams by concatenating sets of bits, wherein each set of bits comprises bits that are located at a same respective location in each one of the different third streams, wherein an order of the sets of bits corresponds to respective locations of bits of the sets of bits.

19. The encoder according to claim 11, wherein the merging of the third streams is executed during a single clock cycle.

20. The encoder according to claim 11, wherein a number of the multiple second streams is a power of two.

* * * * *